(12) United States Patent
Barnett

(10) Patent No.: US 6,930,531 B2
(45) Date of Patent: Aug. 16, 2005

(54) CIRCUIT AND METHOD TO COMPENSATE FOR RMR VARIATIONS AND FOR SHUNT RESISTANCE ACROSS RMR IN AN OPEN LOOP CURRENT BIAS ARCHITECTURE

(75) Inventor: Raymond Elijah Barnett, Apple Valley, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/696,827

(22) Filed: Oct. 30, 2003

(65) Prior Publication Data

US 2005/0093609 A1 May 5, 2005

(51) Int. Cl.[7] ............................................... G06G 7/24
(52) U.S. Cl. ...................................... 327/346; 327/348
(58) Field of Search ................. 327/108–112, 346–348, 327/363

(56) References Cited

U.S. PATENT DOCUMENTS 6,160,404 A * 12/2000 Schenk ........................ 324/464

* cited by examiner

*Primary Examiner*—Kenneth B. Wells
(74) *Attorney, Agent, or Firm*—W. Daniel Swayze, Jr.; W. James Brady; Frederick J. Telecky, Jr.

(57) ABSTRACT

The present invention discloses a circuit (10) adapted to compensate for RMR variations and shunt resistance across the RMR comprising a first current source (idc1) coupled to a first resistor (r1), a second current source (idc2) coupled to a second resistor (r2), wherein the first resistor (r1) and the second resistor (r2) are coupled, a resistive sensor (RMR) coupled on either side to a third resistor (r3) and to a fourth resistor (r4), and a transconductance feedback block (GM) coupled to the resistive sensor (RMR), the third resistor (r3), and to the fourth resistor (r4).

18 Claims, 1 Drawing Sheet

CIRCUIT AND METHOD TO COMPENSATE FOR RMR VARIATIONS AND FOR SHUNT RESISTANCE ACROSS RMR IN AN OPEN LOOP CURRENT BIAS ARCHITECTURE

FIELD OF THE INVENTION

The present invention relates to open loop current bias architectures and, more particularly, to a circuit to compensate for RMR variations and shunt resistance across RMR in an open loop current bias architecture.

BACKGROUND OF THE INVENTION

The present invention achieves advantages as a circuit to compensate for RMR variations and to compensate for shunt resistance across RMR in an open loop current bias architecture. Prior designs use open loop Ibias architecture which has around a 3% variation in bias current over typical RMR ranges and that does not compensate for shunt resistance across the RMR. In addition, newer designs target TGMR heads which are around four times higher resistance than prior design specifications with the resulting error in open loop designs being greater than 10%. Further, the shunt resistance is inherent if a high band-width resistive feedback amplifier is used as a sensing amplifier. The feedback resistors appear in parallel to the RMR (resistive sensor) shunting away bias current intended for the RMR. The present invention uses a gm amplifier that senses the voltage across the RMR and adjusts the bias to compensate for its resistance and for shunt resistance. The method does so without measuring the value of the RMR directly.

SUMMARY OF THE INVENTION

In one embodiment of the present invention, a circuit adapted to compensate for RMR variations comprises a first current source coupled to a first resistor, a second current source coupled to a second resistor, wherein the first resistor and the second resistor are coupled, a resistive sensor coupled on either side to a third resistor and to a fourth resistor, and a transconductance feedback block coupled to the resistive sensor, the third resistor, and to the fourth resistor.

In another embodiment of the present invention, a circuit adapted to compensate for shunt resistance across a resistive sensor comprises a first current source coupled to a first resistor, a second current source coupled to a second resistor, wherein the first resistor and the second resistor are coupled, a resistive sensor coupled on either side to a third resistor and to a fourth resistor, a transconductance feedback block coupled to the resistive sensor, the third resistor, and to the fourth resistor, and a shunt resistor coupled to the resistive sensor, the third resistor, and to the fourth resistor.

In a further embodiment of the present invention, a method for compensating for RMR variations in an open loop current bias architecture comprises producing a first voltage at an output node of a first closed loop buffer, producing a second voltage at an output node of a second closed loop buffer, applying the first voltage and the second voltage across a serially coupled resistor, a resistive sensor, and another resistor, wherein the resistor is coupled to the first closed loop buffer and the other resistor is coupled to the second closed loop buffer, and establishing a voltage across input nodes of a transconductance feedback block coupled to the serially coupled resistors.

In yet another embodiment of the present invention, a method for compensating for shunt resistance across a resistive sensor comprises producing a first voltage at an output node of a first closed loop buffer, producing a second voltage at an output node of a second closed loop buffer, applying the first voltage and the second voltage across a serially coupled resistor, a resistive sensor, another resistor, and a shunt resistance wherein the resistor is coupled to the first closed loop buffer, the other resistor is coupled to the second closed loop buffer, and the shunt resistance is coupled in parallel to the serially coupled resistors, and increasing a current through the resistive sensor to increase a current shunted away from the resistive sensor by the shunt resistance.

DETAILED DESCRIPTION OF THE INVENTION

Circuit 10 Description

Figure 1:
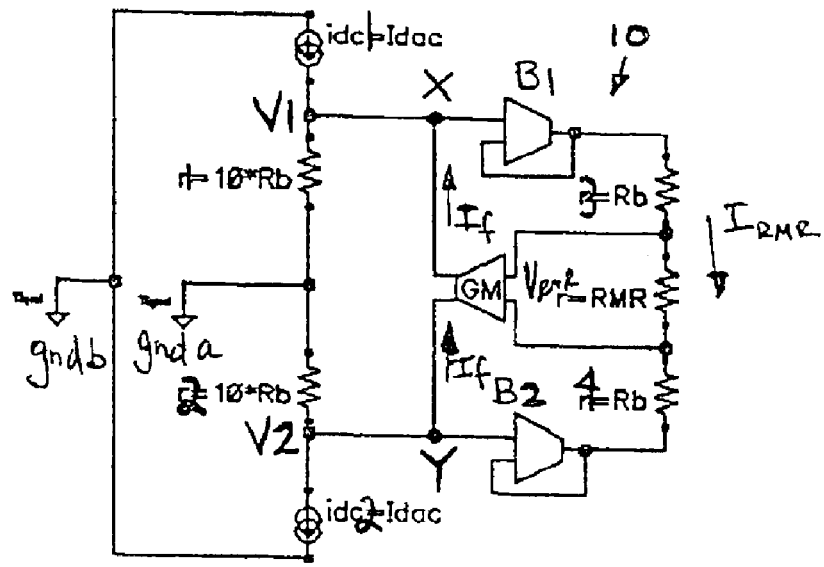
FIG. 1 illustrates a circuit to compensate for RMR variations in an open loop current bias architecture in accordance with an exemplary embodiment of the presented invention.

Referring now to FIG. 1, a RMR Ibias circuit 10 includes current sources idc1 and idc2, resistors r1 and r2, unity gain closed loop buffers B1 and B2, resistors r3 and r4, transconductance feedback block GM, and resistance RMR.

Current source idc1 is connected between gndb and the common node X of r1, the output of transconductance feedback block GM, and the input of unity gain closed loop buffer B1. Resistor r1 is connected between node X and gnda. The output node of unity gain closed loop buffer B1 is connected to r3 at one end of a resistor string composed of r3, RMR, and r4. The common node of r3 and RMR is connected to the first input of transconductance feedback block GM. The common node of r4 and RMR is connected to the second input of GM.

Current source idc2 is connected between gndb and the common node Y of r2, the output of transconductance feedback block GM, and the input of unity gain closed loop buffer B2. Resistor r2 is connected between node Y and gnda. The output node of unity gain closed loop buffer B2 is connected to r4 at one end of a resistor string composed of r3, RMR, and r4.

The resistors r1 and r2 each have a resistance value that is represented by 10*Rb, the resistors r3 and r4 each have a resistance value that is represented by Rb, and the resistance RMR has a resistance that is represented by the value RMR. The transconductance feedback block GM both sources and sinks a current If that is 1/(2*X*Rb) times the voltage that is placed across its input nodes. In the preceding equation, it is preferred that the value of X=10. In alternate embodiments, the value of X can be a greater or lesser number.

Circuit 10 Operation

Referring again to FIG. 1, the first current source idc1 supplies a programmable current Idac to the first buffer input node X. Transconductance feedback block GM, which supplies feedback current If to the first buffer input node X, is described by the following equation:

$$GM = 1/(2*10*Rb) \tag{1}$$

Currents Idac and If flow through resistor r1 to ground gnda. The flow of currents Idac and If through resistor r1 will cause voltage V1 to be established at the first buffer input node X. Thus, the voltage V1 is described by the following equation:

$$V1 = (Idac + If) * r1 \quad (2)$$

Second current source idc2 sinks a programmable current Idac from the second buffer input node Y. Transconductance feedback block GM sinks feedback current If from second buffer input node Y. Currents Idac and If flow through resistor r2 from ground gnda. The flow of currents Idac and If through resistor r2 will cause voltage V2 to be established at the second buffer input node Y. Since resistor r2 is equal in value to resistor r1 the voltage V2 will be equal in magnitude to the voltage V1 but it will be opposite in its polarity to the voltage V1 when both voltages are defined with respect to ground gnda. Thus, voltage V2 is described by the following equation:

$$V2 = -V1 \quad (3)$$

Unity gain closed loop buffer B1 will produce a voltage at its output node that is equal to the voltage V1 that appears at the first buffer input node X. Unity gain closed loop buffer B2 will produce a voltage at its output node that is equal to the voltage V2 that appears at the second buffer input node Y. The buffered voltages V1 and V2 are applied across the resistor string consisting of r3, RMR and r4. This will cause current IRMR to flow between the output node of B1 and the output node of B2 through the resistor string of r3, RMR, and r4. By Ohm's law, the current IRMR is given by the following equation:

$$IRMR = (V1 - V2)/(r3 + RMR + r4) \quad (4)$$

Since r3 has a resistance value of Rb, r4 has a resistance value of Rb, and RMR has resistance value of RMR this equation can be written as:

$$IRMR = (V1 - V2)/(2*Rb + RMR) \quad (5)$$

The current IRMR that flows through resistance RMR will establish a voltage VRMR across the input nodes of the transconductance feedback block GM. This voltage VRMR is defined by the following equations:

$$VRMR = IRMR * RMR \quad (6)$$

The transconductance feedback block GM will source a feedback current If to first buffer input node X that is $1/(20*Rb)$ times the voltage VRMR that is placed across its input nodes. The transconductance feedback block GM will sink a feedback current If from second buffer input node Y that is $1/(20*Rb)$ times the voltage VRMR that is placed across its input terminals. Thus, the feedback current If is defined by the following equation:

$$If = VRMR/(20*Rb) \quad (7)$$

To show that current IRMR depends only on the value Idac, the circuit equations described above may be used. Current IRMR has been shown to be described by the fifth equation $IRMR = (V1 - V2)/(2*Rb + RMR)$. Since the third equation has shown $V2 = -V1$, the equation for IRMR can be written as:

$$IRMR = (2V1)/(2*Rb + RMR) \quad (8)$$

In the second equation, voltage V1 has been shown to be represented by the equation $V1 = (Idac + If)*r1$. Substituting this into the equation for IRMR yields the following equation:

$$IRMR = 2*r1*(Idac + If)/(2*Rb + RMR) \quad (9)$$

Since r1 has a resistance value of 10*Rb, this equation can be written as:

$$IRMR = 20*Rb*(Idac + If)/(2*Rb + RMR) \quad (10)$$

In equation 6, the voltage VRMR across resistance RMR has been shown to be described by the equation $VRMR = IRMR*RMR$, and in equation 7, the feedback current If has been shown to be described by the equation $If = VRMR/(20*Rb)$.

The equations for current If and voltage VRMR may be combined to provide the following equation:

$$If = IRMR*RMR/(20*Rb) \quad (11)$$

This expression for current If may now be substituted into the equation for IRMR to give the equation:

$$IRMR = 20*Rb*(Idac + IRMR*RMR/20*Rb)/(2*Rb + RMR) \quad (12)$$

This equation can be simplified to:

$$IRMR = 10 Idac \quad (13)$$

This relationship between IRMR and Idac shows that the current IRMR is independent of resistance RMR when positive feedback is applied in the RMR Ibias circuit 10.

Circuit 10 Summary

The circuit 10 modifies the open loop ibias architecture to compensate for RMR variations in an open loop current bias architecture. The open loop architecture uses an internal bandgap voltage over internal resistor current that is DAC'ed by the user. This is shown as two current sources idac in both diagrams. This results in a temperature stable programmable voltage that is buffered with unity gain closed loop buffers. The buffered voltage drives the resistor string consisting of Rb-RMR-Rb. Rb resistors are matched to the 10*Rb resistors providing a 10:1 current gain to the RMR. If RMR is zero ohms, the current transfer is exactly 10:1.

Prior designs handle around a 25 ohm to around a 70 ohm RMR range and newer TGMR designs handle around a 100 ohm to around a 400 ohm RMR variation. Thus, the resistive divider including RMR causes an error to the programmed current. This current can be centered at nominal RMR but variations in typical values can cause about 3% variation in Ibias. TGMR designs based on this design can see over 10% variation. The correction circuit 10 is a positive feedback GM that is set according to the equations above. The current is corrected without knowledge of the exact value of RMR directly and is used with existing open loop Ibias architectures. The feedback uses the voltage across the RMR and a 1/GM matched to internal resistor Rb.

Circuit 20 Description

Figure 2:
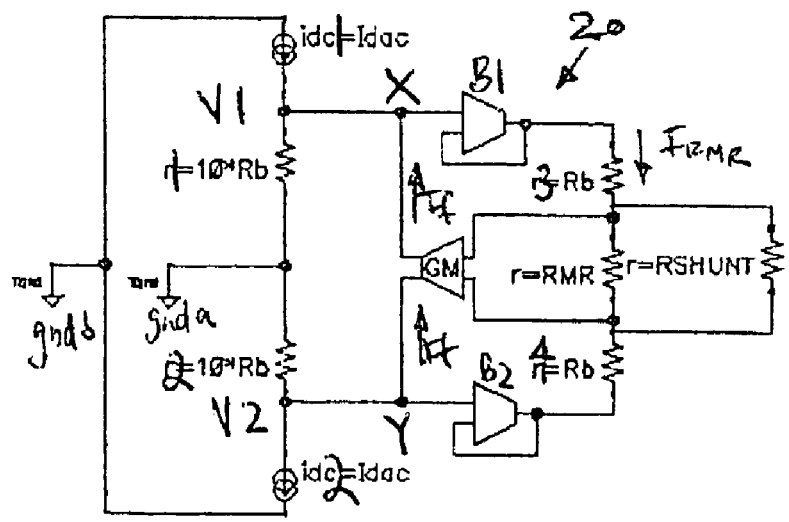
FIG. 2 illustrates a circuit to compensate for shunt resistance across RMR in an open loop current bias architecture in accordance with an exemplary embodiment of the present invention.

Referring now to FIG. 2, a RMR bias circuit 20 includes current sources idc1 and idc2, resistors r1 and r2, unity gain closed loop buffers B1 and B2, resistors r3 and r4, transconductance feedback block GM, resistive sensor RMR, and shunt resistance RSHUNT.

Current source idc1 is connected between gndb and the common node X of r1, the output of transconductance feedback block GM, and the input of unity gain closed loop buffer B1. Resistor r1 is connected between node X and gnda. The output node of unity gain closed loop buffer B1 is connected to r3 at one end of a resistor string composed of r3, RMR, and r4. Resistance RSHUNT is connected across resistor RMR. The common node of r3, RSHUNT and RMR is connected to the first input of transconductance feedback block GM. The common node of r4, RSHUNT and RMR is connected to the second input of GM.

Current source idc2 is connected between gnda and the common node Y of r2, the output of transconductance feedback block GM, and the input of unity gain closed loop buffer B2. Resistor r2 is connected between node Y and gnda. The output node of unity gain closed loop buffer B2 is connected to r4 at one end of the resistor string composed of r3, RMR, and r4.

Circuit 20 Operation

The purpose of the RMR Ibias circuit 20 is to provide a programmed current through the resistive sensor RMR. This current through RMR is controlled by the current sources idc1 and idc2. Current source idc1 will provide a current through resistor r1 to first ground node gnda. This current through resistor r1 will cause voltage V1 to occur at the input node X of the first unity gain closed loop buffer B1. Buffer B1 will then drive voltage V1 at its output node connected to resistor r3. Current source idc2 will provide a current through resistor r2 to first ground node gnda. This current through resistor r2 will cause voltage V2 to occur at the input node Y of the second unity gain closed loop buffer B2. Buffer B2 will then drive voltage V2 at its output node connected to resistor r4. Thus, the voltages V1 and V2 will be applied at opposite ends of the resistor string composed of r3, r4, and RMR. The difference in voltages V1 and V2 at each end of the resistor string of r3, r4 and resistive sensor RMR will cause a current to flow through the resistor string from the output of buffer B1 to the output of buffer B2. This current will flow through resistive sensor RMR and will thus provide current bias to resistive sensor RMR.

In the intended application of the RMR Ibias circuit 20, a sensing amplifier (not shown) can be connected across resistor RMR. The sensing amplifier will sense voltage changes across resistive sensor RMR. It is these changes in voltage across resistive sensor RMR that represent the reading of data in a hard disk data storage system. The sensing amplifier is typically a high bandwidth resistive feedback amplifier that is connected to each end of resistive sensor RMR. This amplifier will have the effect of shunting bias current away from the resistive sensor RMR.

The shunt resistance of the sensing amplifier circuit may be represented by the resistance RSHUNT in parallel with resistive sensor RMR. The parallel resistors RMR and RSHUNT act as a current divider. A portion of the bias current through the resistive string will flow through resistive sensor RMR and a portion of the bias current through the resistor string will flow through resistor RSHUNT. The total of the current through RMR and RSHUNT will be equal to the total bias current that flows through the resistor string. Thus, the current through resistive sensor RMR will be less than the desired bias current due to the effect of shunt resistance RSHUNT.

In order to compensate for the bias current that is diverted from resistive sensor RMR by RSHUNT, positive feedback is used to adjust the voltage bias of the resistor string of r3, r4, RMR and RSHUNT. This positive feedback is provided by the transconductance feedback block GM, which is described by the following equation:

$$GM = 1/(2*10*Rb+10*RSHUNT) \quad (14)$$

The transconductance feedback block GM will source a feedback current If to first buffer input node X that is $1/(20*Rb+10*RSHUNT)$ times the voltage VRMR that is placed across its input nodes. The addition of feedback current If to the buffer B1 input X will increase the current that flows through resistor r1 to the first ground node gnda. By increasing the amount of current that flows through resistor r1, the voltage drop across resistor r1 will be increased. Thus, the voltage at the buffer B1 input node X will be increased. This increase in voltage at the buffer B1 input node X will then be driven by the buffer B1 to its buffer output node that is connected to resistor r3.

The transconductance feedback block GM will sink a feedback current If from second buffer input node Y that is $1/(20*Rb+10*RSHUNT)$ times the voltage VRMR that is placed across its input terminals. The addition of feedback current If to the buffer B2 input Y will increase the current that flows through resistor r2 from the first ground node gnda. By increasing the amount of current that flows through resistor r2, the voltage drop across resistor r2 will be increased. Thus, the voltage at buffer B2 input node Y will be decreased. This decrease in voltage at buffer B2 input node Y will then be driven by buffer B2 to its buffer output node that is connected to resistor r4.

Since it has been previously shown that the voltage at the common node of the output of buffer B1 and resistor r3 has been increased, driving a lower voltage at the common node of the output of buffer B2 and r4 will cause an increase in the total voltage across the resistor string composed of r3, r4, RMR and RSHUNT. This increase in voltage across the resistor string will cause an increase in the amount of current that flows through the resistor string. This increase in current through the resistor string will cause an increase in the bias current through resistive sensor RMR. This increase in current through resistive sensor RMR will act to correct the current shunted away from the resistive sensor RMR by the shunt resistance RSHUNT. Thus, the current through resistive sensor RMR is independent of resistance RSHUNT when positive feedback is applied in the RMR open loop Ibias circuit embodiment as described.

Circuit 20 Summary

The circuit 20 compensates for shunt resistance across RMR in an open loop current bias (Ibias) architecture. The open loop architecture uses an internal bandgap voltage over internal resistor current that is DAC'ed by a user and is shown as the current sources Idc1 and Idc2. This results in a temperature stable programmable voltage that is buffered with unity gain closed loop buffers. The buffered voltage drives the resistor string consisting of Rb-RMR-Rb. Rb resistors are matched to the 10*Rb resistors providing a 10:1 current gain to the RMR. If RMR is zero ohms, the current transfer is exactly 10:1. Prior designs handle around a 25 ohm to around a 70 ohm RMR range and newer TGMR designs handle around a 100 ohm to around a 400 ohm RMR variation.

Thus the resistive divider including RMR causes an error to the programmed current. This current can be centered at nominal RMR but variations in typical values can cause about 3% variation in Ibias. TGMR designs based on this design can see over 10% variation. In addition to the RMR variation, the shunt resistance across the head is compensated. The correction circuit for both errors is a positive feedback GM that is set according to equation 14 above.

Although an exemplary embodiment of the present invention has been illustrated in the accompanied drawings and described in the foregoing detailed description, it will be understood that the invention is not limited to the embodiments disclosed, but is capable of numerous rearrangements, modifications, and substitutions without departing from the spirit of the invention as set forth and defined by the following claims. For example, although one GM is shown for the circuits 10 and 20 errors and other limitations can be corrected separately by the use of two GM's or by the use of a combined GM as shown in FIGS. 1 and 2.

What is claimed is:

1. A method for compensating for RMR variations in an open loop current bias architecture, comprising:
   producing a first voltage at an output node of a first closed loop buffer;
   producing a second voltage at an output node of a second closed loop buffer;
   applying the first voltage and the second voltage across a serially coupled resistor, a resistive sensor, and another resistor, wherein the resistor is coupled to the first closed loop buffer and the other resistor is coupled to the second closed loop buffer; and
   establishing a voltage across input nodes of a transconductance feedback block coupled to the serially coupled resistors.

2. The method of claim 1 further comprising sourcing a feedback current to an input node of the first closed loop buffer by the transconductance feedback block.

3. The method of claim 1 further comprising sinking a feedback current from an input node of the second closed loop buffer by the transconductance feedback block.

4. The method of claim 1, wherein the first voltage is equal to a voltage produced between a serially coupled first current source and first resistor at an input node of the first closed loop buffer.

5. The method of claim 4 further comprising supplying a programmable current to the input node of the first closed loop buffer by the first current source.

6. The method of claim 5 further comprising supplying a feedback current to the input node of the first closed loop buffer by the transconductance feedback block.

7. The method of claim 6 further comprising establishing a voltage at the input node of the first closed loop buffer.

8. The method of claim 7, wherein the voltage is established as the programmable current and the feedback current flow through the first resistor to a ground coupled to the first resistor.

9. The method of claim 1, wherein the second voltage is equal to a voltage produced between a serially coupled second current source and second resistor at an input node of the second closed loop buffer.

10. The method of claim 9 further comprising sinking a programmable current from the input node of the second closed loop buffer by the second current source.

11. The method of claim 10 further comprising sinking a feedback current from the input node of the second closed loop buffer by the transconductance feedback block.

12. The method of claim 11 further comprising establishing a voltage at the input node of the second closed loop buffer.

13. The method of claim 12, wherein the voltage is established as the programmable current and the feedback current flow through the second resistor from a ground coupled to the second resistor.

14. The method of claim 1 further comprising flowing by a current between the output node of the first closed loop buffer, the output node of the second closed loop buffer, and through the serially coupled resistors when the first voltage and the second voltage is applied across the serially coupled resistors.

15. The method of claim 14 further comprising the step of flowing current through the resistive sensor thereby establishing the voltage across the input nodes of the transconductance feedback block.

16. The method of claim 15, wherein the current depends on a value of a programmable current that has been sourced to an input node of the first closed loop buffer.

17. The method of claim 15, wherein the current depends on a value of a programmable current that has been sinked from an input node of the second closed loop buffer.

18. The method of claim 15 further comprising correcting a feedback current independent of a resistance value of the resistive sensor.

* * * * *